(12) United States Patent
Wu et al.

(10) Patent No.: US 8,839,848 B2
(45) Date of Patent: Sep. 23, 2014

(54) CABINET, AND CABINET TEMPERATURE CONTROL SYSTEM

(75) Inventors: Weixing Wu, Shenzhen (CN); Yuping Hong, Shenzhen (CN); Liqian Zhai, Shenzhen (CN); Xiaoming Kong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1086 days.

(21) Appl. No.: 12/849,779

(22) Filed: Aug. 3, 2010

(65) Prior Publication Data

US 2010/0295429 A1 Nov. 25, 2010

Related U.S. Application Data

(63) Continuation of application No. PCT/CN2009/071225, filed on Apr. 10, 2009.

(30) Foreign Application Priority Data

May 23, 2008 (CN) .......................... 2008 1 0067337

(51) Int. Cl.
*G05D 23/00* (2006.01)
*H05K 7/20* (2006.01)
*F28D 15/00* (2006.01)
*F28D 15/02* (2006.01)
*F24J 3/08* (2006.01)

(52) U.S. Cl.
CPC ............. *H05K 7/20609* (2013.01); *Y02E 10/16* (2013.01); *H05K 7/206* (2013.01); *F28D 15/00* (2013.01); *F28D 15/02* (2013.01); *Y02B 10/40* (2013.01); *F24J 3/086* (2013.01)
USPC ........................................... 165/291; 165/45

(58) Field of Classification Search
USPC .............................. 165/45, 287, 288, 291, 278
See application file for complete search history.

(56) References Cited

U.S. PATENT DOCUMENTS 4,234,037 A * 11/1980 Rogers et al. .................... 165/45
4,476,921 A * 10/1984 Stubbolo ....................... 165/48.1
(Continued)

FOREIGN PATENT DOCUMENTS

CN 2446434 Y 9/2001
CN 2540604 Y 3/2003
(Continued)

OTHER PUBLICATIONS

The international search report of the corresponding patent application No. PCT/CN2009/071225, dated Jul. 23, 2009, total 6 pages.

(Continued)

*Primary Examiner* — Marc Norman
*Assistant Examiner* — Devon Russell
(74) *Attorney, Agent, or Firm* — Conley Rose, P.C.; Grant Rodolph; Nicholas K. Beaulieu

(57) ABSTRACT

A cabinet temperature control system comprises a cabinet and an underground temperature control unit. The cabinet comprises an air discharging chamber and an air introducing chamber which are in communication with each other inside the cabinet. The underground temperature control unit comprises an air discharging chamber and an air introducing chamber which are in communication with each other inside the underground temperature control unit. The air discharging chamber of the cabinet and the air introducing chamber of the underground temperature control unit, and the air discharging chamber of the underground temperature control unit and the air introducing chamber of the cabinet, are in communication with each other respectively, so that the cabinet and the underground temperature control unit form an air circulating circuit. The underground temperature control unit further comprises a radiator arranged in the air circulating circuit. The system also has fans controlled by a control module.

12 Claims, 4 Drawing Sheets

(56) References Cited

U.S. PATENT DOCUMENTS

| | | | |
|---|---|---|---|
| 4,674,561 A | 6/1987 | Kelley | |
| 5,216,577 A | 6/1993 | Schilling | |
| 5,767,690 A * | 6/1998 | Fujimoto | 324/750.08 |
| 5,950,712 A * | 9/1999 | Gates et al. | 165/45 |
| 5,978,218 A * | 11/1999 | Fujimoto et al. | 361/696 |
| 6,208,510 B1 | 3/2001 | Trudeau et al. | |
| 6,538,883 B1 * | 3/2003 | Greer | 361/679.47 |
| 6,628,520 B2 * | 9/2003 | Patel et al. | 361/696 |
| 6,691,766 B1 * | 2/2004 | Azar | 165/45 |
| 2005/0225936 A1 | 10/2005 | Day | |

FOREIGN PATENT DOCUMENTS

| | | |
|---|---|---|
| CN | 2623748 Y | 7/2004 |
| CN | 2836281 Y | 11/2006 |
| CN | 1946279 A | 4/2007 |
| EP | 0848469 A | 6/1998 |
| EP | 1755368 A2 | 2/2007 |
| JP | 2003194420 A | 7/2003 |
| JP | 2006202816 A | 8/2006 |
| WO | 2009006908 A | 1/2009 |

OTHER PUBLICATIONS

The European search report of the corresponding patent application No. EP09006732.3, dated Sep. 21, 2009, total 14 ppages.

The European office action of the corresponding patent application No. EP09006732.3, dated Mar. 10, 2010, total 4 pages.

Written Opinion of corresponding PCT Patent Application No. PCT/CN2009/071225, mailed on Jul. 23, 2009, 4 pages total.

* cited by examiner

CABINET, AND CABINET TEMPERATURE CONTROL SYSTEM

CROSS-REFERENCE TO RELATED APPLICATIONS

This application is a continuation of International Application No. PCT/CN2009/071225, filed on Apr. 10, 2009, which claims priority to Chinese Patent Application No. 200810067337.9, filed on May 23, 2008, both of which are hereby incorporated by reference in their entireties.

FIELD OF THE INVENTION

The invention relates to a temperature control system, and, in particular, to a cabinet and a cabinet temperature control system.

BACKGROUND OF THE INVENTION

With the industrial development on the earth, more and more natural resources are being consumed and the environment is more and more deteriorated. Some apparent phenomena of the worsening environment include greenhouse effects, acid rain, etc. Therefore, how to protect the earth while utilizing the limited resources to promote further industrial development has become a common concern of all people on the earth.

Electronic equipment has stringent requirements on environmental temperatures. Generally speaking, electronic equipment may emit heat during operation, and the emitted heat may gather in the areas surrounding the equipment, thereby causing the operation environment temperature to rise. When the environmental temperature rises to a certain extent, the electronic equipment would not work properly. Therefore, an air conditioner or other cooling apparatus are often needed for the equipment. Similarly, if the environmental temperature is too low, the operation of the electronic equipment would also be affected. Therefore, the electronic equipment located at low temperature regions may need to be heated.

Currently, natural cooling solutions for outdoor electronic equipment cabinets are widely used in medium to low-power equipment cabinets. In order to enhance the cooling ability of the outdoor cabinets and to increase the operation power level of the outdoor electronic equipment, a wrinkled-wall structure is often adopted for the cabinets, which is in addition to the installation of a heat insulation layer and/or a sun-shielding cover at the top of the cabinets. The wrinkled-wall structure effectively increases the heat dissipating area, and it is a usually-taken measure to enhance the natural heat exchanging ability of the cabinets. The air heated by the power-consuming equipment circulates inside a cabinet and exchanges the heat with the outside environment via the walls of the cabinet, so as to maintain the normal operation of the equipment arranged inside the cabinet.

The electronic equipment is being designed with more and more powerful functions as well as higher and higher degrees of integration. How to further improve the cooling ability of the electronic equipment under the premise of being environmentally friendly and energy-saving becomes a problem that needs to be solved urgently.

SUMMARY OF THE INVENTION

Embodiments of the present invention provide a cabinet temperature control system which takes advantage of a ground source heat pump system and makes fully use of the cold and heat storage effect of soil in the earth's shallow surface layer to improve the cooling efficiency and reliability of the cabinet.

The cabinet temperature control system of the present invention includes a cabinet and an underground temperature control unit, in which the cabinet includes an air discharging chamber and an air introducing chamber, and the air discharging chamber and the air introducing chamber of the cabinet are in communication with each other inside the cabinet;

the underground temperature control unit includes an air discharging chamber and an air introducing chamber, and the air discharging chamber and the air introducing chamber of the underground temperature control unit are in communication with each other inside the underground temperature control unit;

the air discharging chamber of the cabinet and the air introducing chamber of the underground temperature control unit are in communication with each other, and the air discharging chamber of the underground temperature control unit and the air introducing chamber of the cabinet are in communication with each other, so that the cabinet and the underground temperature control unit form an air circulating circuit; and the underground temperature control unit further includes a radiator arranged in the air circulating circuit.

Meanwhile, embodiments of the invention also provide an underground temperature control apparatus, the interior of the underground temperature control apparatus includes an air discharging chamber and an air introducing chamber, and the air discharging chamber and the air introducing chamber of the underground temperature control apparatus are in communication with each other inside the apparatus; and the air discharging chamber and the air introducing chamber of the underground temperature control apparatus are in communication with an air introducing chamber and an air discharging chamber of an external equipment, respectively, so that an air circulating circuit is formed between the underground temperature control apparatus and the external device; and the underground temperature control unit further includes a radiator arranged in the air circulating circuit.

Further, a cabinet is provided. The cabinet includes an air discharging chamber and an air introducing chamber, and the air discharging chamber and the air introducing chamber of the cabinet are in communication with each other inside the cabinet; and the air discharging chamber and the air introducing chamber of the cabinet are in communication with an air introducing chamber and an air discharging chamber of an underground cooling apparatus, respectively, so that an air circulating circuit is formed between the cabinet and the underground cooling apparatus.

The cabinet temperature control system according to the embodiments of the invention includes a cabinet and an underground temperature control unit. Each of the cabinet and the underground temperature is provided with an air discharging chamber and an air introducing chamber. These air discharging chambers and air introducing chambers are in communication with each other to form an air circulating circuit. The air circulates in the air circulating circuit by the action of an air transporting device, so that, in combination with the temperature adjusting function of the underground temperature control unit, air inside the cabinet can reach an appropriate temperature. The system makes effective use of the cold and heat storage effect of the soil in the Earth's shallow surface layer to improve the cooling efficiency and reliability, and the system is environmentally friendly as well as energy-saving.

DETAILED DESCRIPTION

Figure 1:
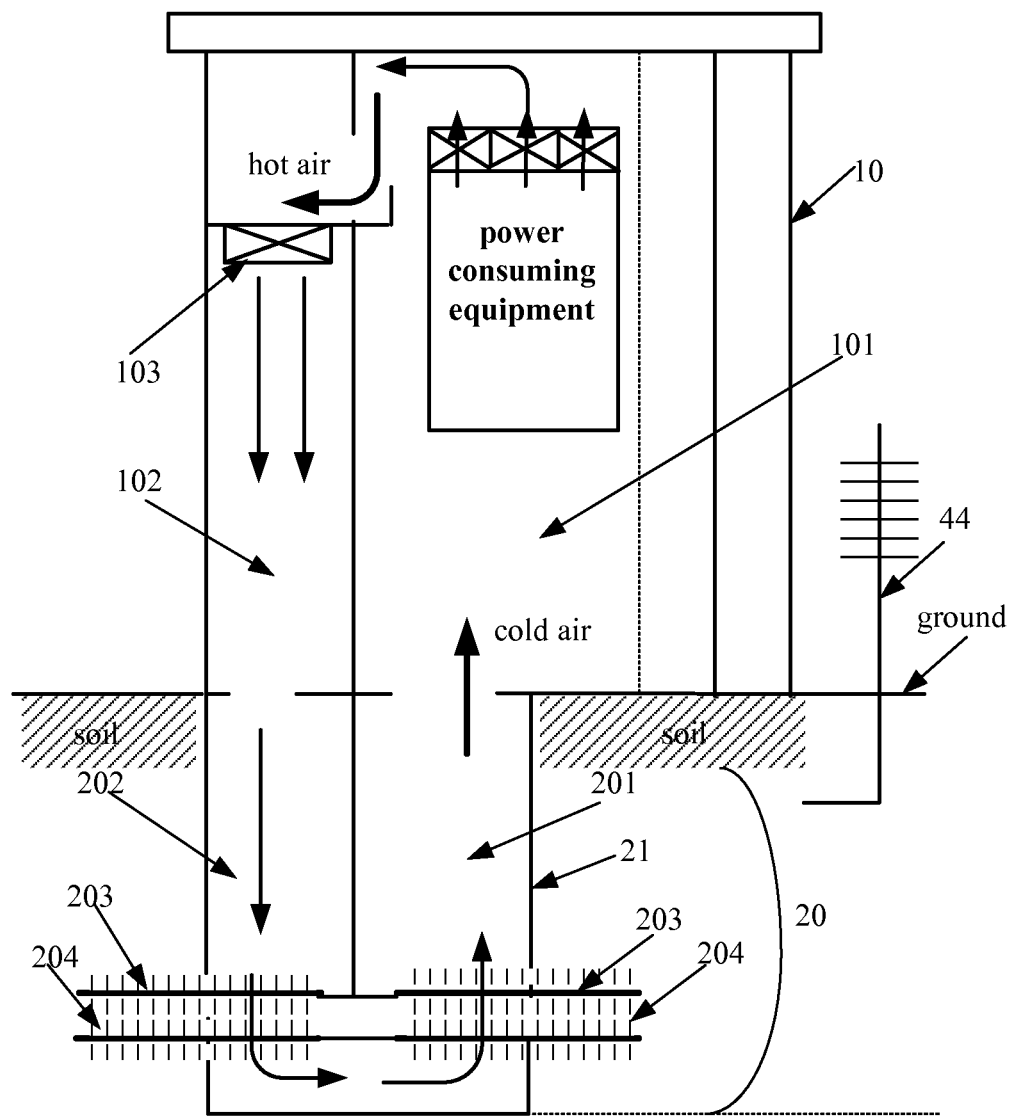
FIG. 1 is a schematic structural diagram showing a cabinet temperature control system according to an embodiment of the present invention.

As shown in FIG. 1, a cabinet temperature control system according to an embodiment of the invention includes a cabinet 10 arranged above the ground and an underground temperature control unit 20 arranged under the ground.

An air introducing chamber 101 and an air discharging chamber 102 are formed inside the cabinet 10. The air introducing chamber 101 and the air discharging chamber 102 are in communication with each other at the interior top end of the cabinet 10, with the air discharging chamber 102 being the outlet of a heated air channel in the cabinet 10.

An air discharging chamber 201 and an air introducing chamber 202 are also formed inside the underground temperature control unit 20. The air discharging chamber 201 and the air introducing chamber 202 are in communication with each other at the interior bottom end of the underground temperature control unit 20.

The air discharging chamber 102 inside the cabinet 10 is in communication with the air introducing chamber 202 inside the underground temperature control unit 20, and the air discharging chamber 201 inside the underground temperature control unit 20 is in communication with the air introducing chamber 101 inside the cabinet 10, thereby forming an air circulating circuit.

An air transporting device 103 is installed in the air circulating circuit. In this embodiment, the air transporting device 103 is a fan. The air inside the closed system flows within the air circulating circuit by the action of the air transporting device 103, so that, in combination with a temperature adjusting function of the underground temperature control unit 20, the air inside the cabinet 10 may reach an appropriate temperature.

The underground temperature control unit 20 includes an underground base 21 having a radiator 203 therein. The radiator 203 may be positioned in the air introducing chamber 202 and the air discharging chamber 201. Alternatively, the radiator 203 may be installed in the air introducing chamber 202 or the air discharging chamber 201. One end of the radiator 203 is positioned inside the underground base 21, while the other end penetrates the underground base 21 and extends into the soil or underground water surrounding the underground base 21.

The radiator 203 exhibits a good heat exchanging ability, because one end of the radiator 203 is placed inside the underground base 21 and the other end is in contact with the soil or underground water. On one hand, the higher temperature of the air inside the underground base 21 can be transferred into the earth so as to lower the temperature of the cabinet 10; on the other hand, the higher temperature inside the earth can be transferred to the air inside the underground base 21 so as to raise the temperature of the cabinet 10.

Figure 2:
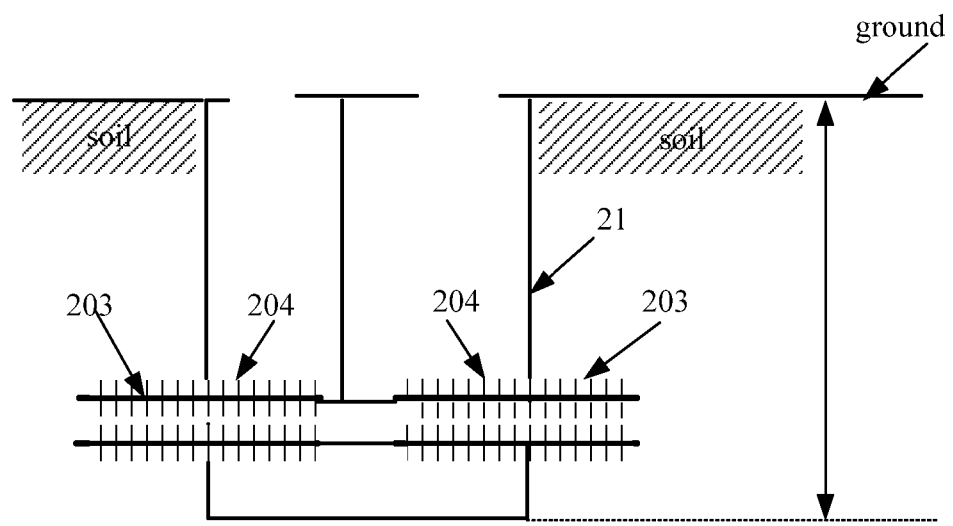
FIG. 2 is a schematic structural diagram of a radiator of the cabinet temperature control system shown in FIG. 1, with heat radiating fins at one end thereof.

In order to improve the heat exchange efficiency, a portion of the radiator 203 which is located inside the underground base 21 is provided with radiating fins 204. The structure of the underground base 21 having the radiator and the radiating fins is shown in FIG. 2. A portion of the radiator 203 which extends into the soil or underground water around the underground base 21 may also be provided with the radiating fins 204. The radiating fins 204 can increase the contact area of the radiator 203 with the soil or underground water, resulting in a faster heat exchange.

In order to prevent the radiator 203 from being eroded, the portion of the radiator 203 which extends into the soil or underground water around the underground base 21 is made of ceramics, or made of stainless steel or shaped material coated with plastic on the outer surface, so that the radiator 203 can be better protected from being eroded or rusted.

Meanwhile, in order to protect the equipment and increase the efficiency of the temperature control, a sealing connection is provided between the radiator 203 and the underground base 21. As one selectable option, the radiator 203 is connected with the underground base 21 via a flange plate, i.e., a dual-face flange plate is provided at the middle portion of the radiator 203 and is embed into the underground base 21 with a sealing rubber ring to ensure the air-tightness. As another selectable option, the radiator 203 is connected with the underground base 21 by welding to ensure the air-tightness.

In this embodiment, the radiator 203 serves to perform the heat exchange function and is preferably a heat pipe radiator. If one single heat pipe is provided, the connection with the underground base 21 via the flange plate is preferred. If a plurality of heat pipes are provided, it is preferred that the plurality of heat pipes be made into an entirety and welded to the underground base 21 so as to ensure the air-tightness. As the heat pipe, a linear heat pipe or an L-shaped heat pipe may be used to avoid heat concentration on one location and to enhance the heat exchange ability.

Figure 3:
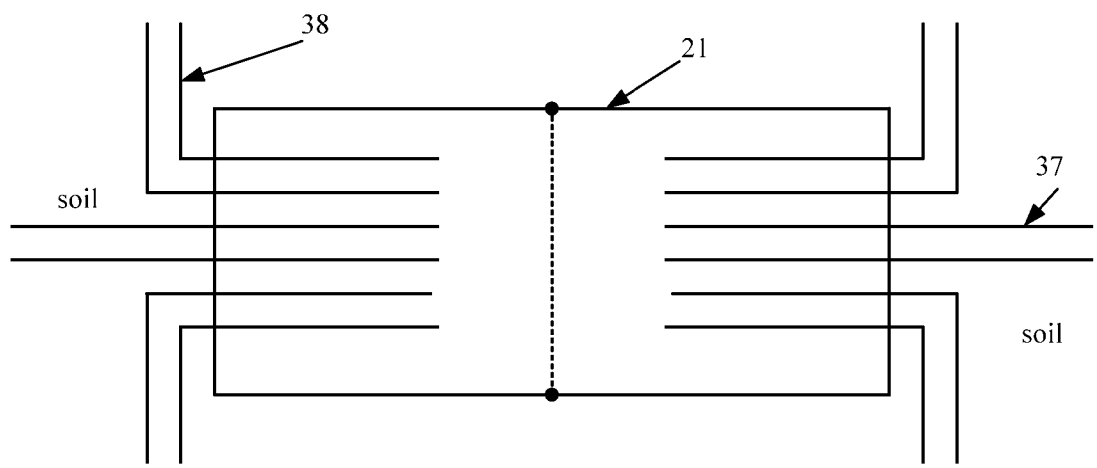
FIG. 3 is a schematic top view of an arrangement of heat pipes in the system shown in FIG. 1.

FIG. 3 is a schematic top view showing the structure of the underground base 21 when a combination of the linear heat pipe 37 and the L-shaped heat pipe 38 is used for the heat pipe radiator 203.

Soil in different regions has different heat transfer coefficients, and the heat transfer coefficient of soil is generally low. When the heat is transferred into the soil, in order to avoid heat accumulation in the soil and to facilitate a timely dissipation of the heat from the soil, a unidirectional heat transferring technique using a thermal bar can be adopted. This technique is known in the art. As shown in FIG. 1, a thermal bar 44 is arranged in the peripheral region around the underground temperature control unit 20 and one end of the thermal bar 44 extends above the ground (on which end radiating fins can be provided). When the soil temperature is higher than the air temperature, the thermal bar 44 conducts the heat from the soil to the atmosphere. With the ease of installation during construction of the temperature control system and the heat exchange efficiency of the earth taken into consideration, the distance from the bottom of the underground base 21 to the ground may be more than 1.5 meters and less than 3 meters.

In actual applications, the cabinet 10 may be placed on an elevated platform. The air discharging chamber 102 inside the cabinet 10 and the air introducing chamber 202 inside the underground temperature control unit 20 are in communication with each other via an air conducting pipe, and the air introducing chamber 101 inside the cabinet 10 and the air discharging chamber 201 inside the underground temperature control unit 20 are in communication with each other via another air conducting pipe. The air discharging chamber 201 and the air introducing chamber 202 inside the underground temperature control unit 20 may also be in communication with each other via an air conducting pipe at the interior bottom end of the underground temperature control unit 20.

Furthermore, the air transporting device 103 serves to cause an air flow between the cabinet 10 and the underground temperature control unit 20. The air transporting device 103 can be a fan or a pump or other devices, and it is preferably installed near the position where the air discharging chamber 102 and air introducing chamber 101 inside the cabinet 10 are connected, so as to ensure a good fluidity of the air.

When the embodiments of the invention are implemented, the cabinet is generally a cabinet provided with electronic equipment therein. Since hot air flows upwardly, the electronic equipment may be placed in the air introducing chamber 101 of the cabinet for ease of cooling the electronic equipment.

In practical applications, air inside the cabinet 10 on the ground is transferred to the underground temperature control unit 20. The underground temperature control unit 20 causes the air to exchange heat with the underground soil or underground water. Specifically, the air exchanges heat with the underground soil or underground water via the radiator 203 placed in the underground temperature control unit 20. The heat-exchanged air is fed back to the cabinet 10.

The cabinet temperature control method of the embodiments of the invention results in air to circulate between the cabinet and the underground temperature control unit. The underground temperature control unit enables air to exchange heat with the underground soil or underground water so that the air inside the cabinet may reach an appropriate temperature. The system makes efficient use of the cold and heat storage effect of the shallow surface layer soil to improve the cooling efficiency and reliability. This method is both environmentally friendly and energy-efficient.

Figure 4:
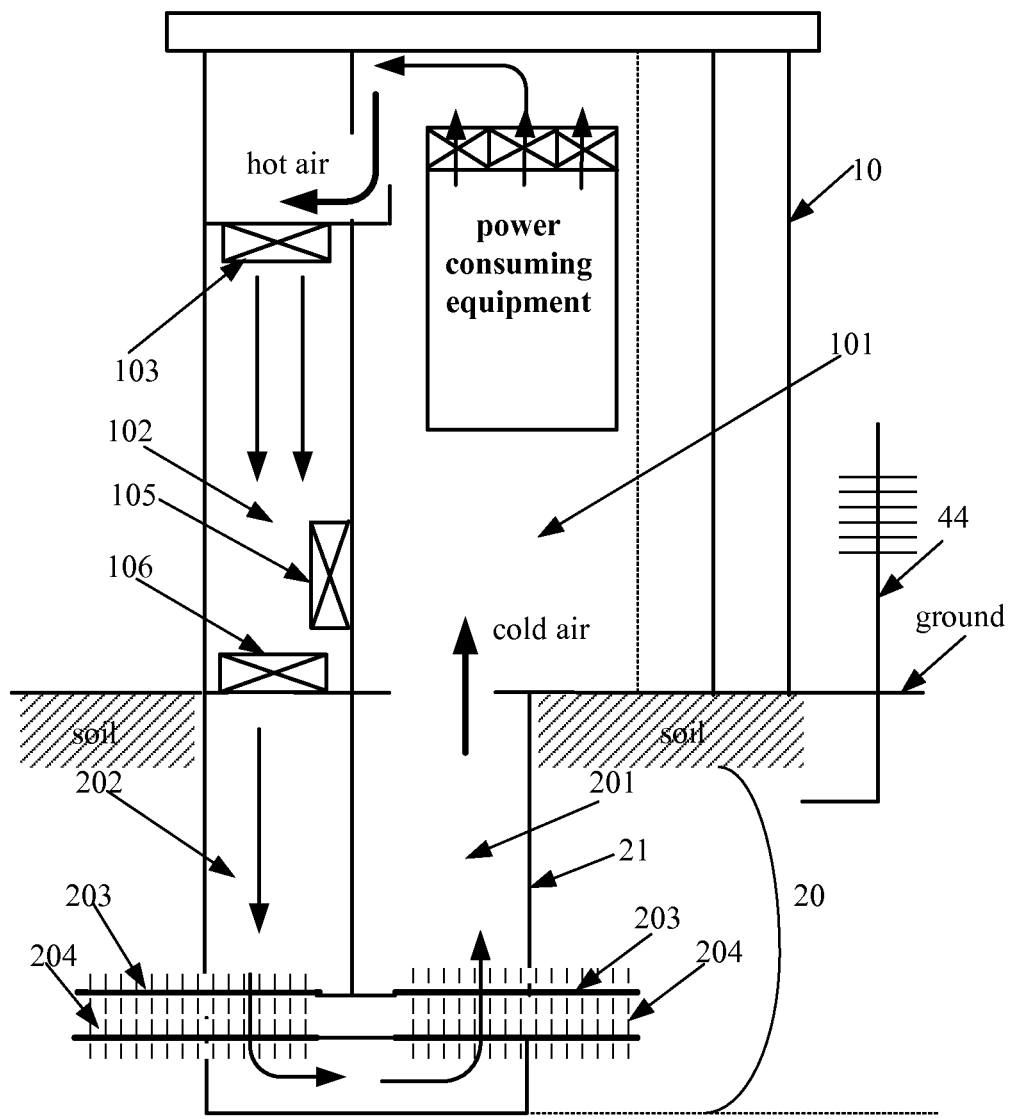
FIG. 4 is a schematic structural diagram of a cabinet temperature control system according to another embodiment of the present invention.
Figure 5:
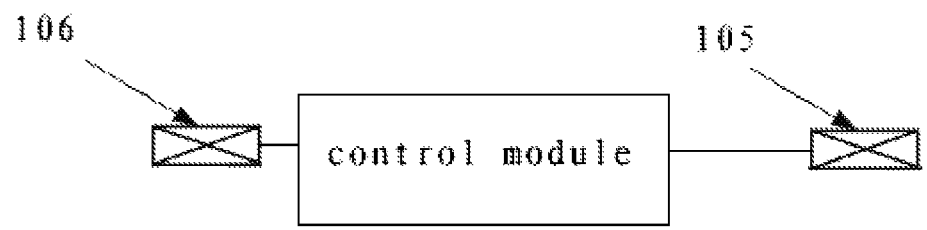
FIG. 5 is a schematic structural diagram of a control module according to an embodiment of the present invention.

FIG. 4 shows a schematic view of another embodiment of the invention, which differs from the previous embodiment in that it has an additional fan system in order to improve the flexibility of the temperature control system. The fan system is placed in the channel of the air discharging chamber 102 of the cabinet. The fan system includes a ground source system fan 106 for transporting hot air into the underground temperature control unit 20, and an internal circulating fan 105 for providing hot air circulating inside the cabinet 10. A control module (as shown in FIG. 5) can be additionally provided to control turn-on/turn-off and rotational speed of these fans. The ground source system fan 106 is positioned between the air discharging chamber 102 of the cabinet 10 and the air introducing chamber 202 of the underground temperature control unit 20. When operating, the ground source fan 106 forces the air to move from the cabinet 10 into the underground temperature control unit 20. The internal circulating fan 105 is positioned between the air discharging chamber 102 of the cabinet 10 and the air introducing chamber 101 of the cabinet 10. When operating, the internal circulating fan 105 forces the air to move from the air discharging chamber 102 into the air introducing chamber 101, thereby causing the air to circulate between the hot air channel and the interior of the cabinet.

The operation of the cabinet and the cabinet temperature control system according to this embodiment of the invention will be described in combination with the control strategy of the control module. Suppose that Ta is an environmental air temperature, T0 is a reference temperature which is used as a main criterion for determining whether or not to employ the ground source cooling solution, Te is a temperature allowable for the equipment, and Tmax is the maximum temperature allowable for the equipment. When Ta>T0, the outdoor cabinet employs the ground source cooling solution, and, at this time, the ground source system fan 106 starts and runs at a full speed while the internal circulating fan 105 stops. During the operation of the equipment, the control module acquires Te and compares it with the Tmax. If Te<Tmax, the speed of the fan 106 is controlled according to a build-in rotational speed adjusting strategy. If Te>Tmax, power consumption of the equipment exceeds the cooling capability of the cooling system, and the system fan 106 runs at the full speed. When Ta<T0 and Te<Tmax, in the outdoor cabinet, the natural cooling solution using cabinet walls is employed, and, at this time, the internal circulating fan 105 starts up and runs at the full speed while the ground source system fan 106 stops. During the operation of the equipment, the control module compares the acquired value of Te against Tmax. If Te>Tmax, the ground source cooling solution is initiated, and, at this time, the ground source system fan 106 starts up while the internal circulating fan 105 stops; and if Te<Tmax, the rotational speed is adjusted according to the build-in rotational speed adjusting strategy.

The addition of the fan system in the above embodiment increases the flexibility in the cabinet cooling solutions, and it is easier to restore the soil temperature due to the use of internal circulating fan.

Described above are some particular embodiments of the invention, and scope of protection of the invention is not limited thereto. People skilled in the art can, within the technical scope disclosed in the invention, easily conceive modifications and replacements that should fall within the scope of protection of the invention. Therefore, the scope of protection of the invention should be defined by the scope of protection claimed in the claims.

What is claimed is:

1. An underground temperature control apparatus, comprising:
    an air discharging chamber; and
    an air introducing chamber,
    wherein the air discharging chamber and the air introducing chamber are in communication with each other inside the underground temperature control apparatus,
    wherein the air discharging chamber is in communication with an air introducing chamber of an external equipment, and the air introducing chamber is in communication with an air discharging chamber of the external equipment such that an air circulating circuit is formed between the underground temperature control apparatus and the external equipment,
    wherein an air transporting device is installed in the air circulating circuit,
    wherein the underground temperature control apparatus further comprises a radiator and an underground base to which the radiator is connected in a sealed connection,
    wherein one end of the radiator is positioned in the air circulating circuit inside the underground base and another end of the radiator penetrates the underground base and extends into the soil around the underground base,
    wherein the underground temperature control apparatus further comprises a ground source system fan, an internal circulating fan, and a control module,
    wherein the ground source system fan is positioned between the air discharging chamber of the external equipment and the air introducing chamber of the underground temperature control apparatus, and when in operation, it forces air into the underground temperature control apparatus from the external equipment, wherein the internal circulating fan is positioned between the air discharging chamber of the external equipment and the air introducing chamber of the external equipment, and when in operation, it forces air into the air introducing chamber of the external equipment from the air discharging chamber of the external equipment, wherein the control module is configured to control operations of the ground source system fan and the internal circulating fan according to a controlling strategy, and wherein the controlling strategy of the ground source system fan and the internal circulating fan comprises:

when Ta>T0, the ground source system fan starts and runs while the internal circulating fan stops, and if Te<Tmax, the rotational speed of the ground source system fan is controlled according to a rotational speed adjusting strategy, wherein Ta is an environmental air temperature, T0 is a reference temperature, Te is a temperature of the equipment inside the external equipment, and Tmax is the maximum temperature allowable for the equipment inside the external equipment.

2. An underground temperature control apparatus, comprising:

an air discharging chamber; and an air introducing chamber, wherein the air discharging chamber and the air introducing chamber are in communication with each other inside the underground temperature control apparatus, wherein the air discharging chamber is in communication with an air introducing chamber of an external equipment, and the air introducing chamber is in communication with an air discharging chamber of the external equipment such that an air circulating circuit is formed between the underground temperature control apparatus and the external equipment, wherein an air transporting device is installed in the air circulating circuit, wherein the underground temperature control apparatus further comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the underground temperature control apparatus further comprises a ground source system fan, an internal circulating fan, and a control module, wherein the ground source system fan is positioned between the air discharging chamber of the external equipment and the air introducing chamber of the underground temperature control apparatus, and when in operation, it forces air into the underground temperature control apparatus from the external equipment, wherein the internal circulating fan is positioned between the air discharging chamber of the external equipment and the air introducing chamber of the external equipment, and when in operation, it forces air into the air introducing chamber of the external equipment from the air discharging chamber of the external equipment, wherein the control module is configured to control operations of the ground source system fan and the internal circulating fan according to a controlling strategy, and wherein the controlling strategy of the ground source system fan and the internal circulating fan comprises:

when Ta>T0, the ground source system fan starts and runs while the internal circulating fan stops, and if Te≥Tmax, the ground source system fan runs at a full speed, wherein Ta is an environmental air temperature, T0 is a reference temperature, Te is a temperature of the equipment inside the external equipment, and Tmax is the maximum temperature allowable for the equipment inside the external equipment.

3. An underground temperature control apparatus, comprising:

an air discharging chamber; and an air introducing chamber, wherein the air discharging chamber and the air introducing chamber are in communication with each other inside the underground temperature control apparatus, wherein the air discharging chamber is in communication with an air introducing chamber of an external equipment, and the air introducing chamber is in communication with an air discharging chamber of the external equipment such that an air circulating circuit is formed between the underground temperature control apparatus and the external equipment, wherein an air transporting device is installed in the air circulating circuit, wherein the underground temperature control apparatus further comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the underground temperature control apparatus further comprises a ground source system fan, an internal circulating fan, and a control module, wherein the ground source system fan is positioned between the air discharging chamber of the external equipment and the air introducing chamber of the underground temperature control apparatus, and when in operation, it forces air into the underground temperature control apparatus from the external equipment, wherein the internal circulating fan is positioned between the air discharging chamber of the external equipment and the air introducing chamber of the external equipment, and when in operation, it forces air into the air introducing chamber of the external equipment from the air discharging chamber of the external equipment, wherein the control module is configured to control operations of the ground source system fan and the internal circulating fan according to a controlling strategy, wherein the controlling strategy of the ground source system fan and the internal circulating fan comprises:

when Ta≤T0 and Te<Tmax, the internal circulating fan starts and runs at a full speed while the ground source system fan stops, wherein Ta is an environmental air temperature, T0 is a reference temperature, Te is a temperature of the equipment inside the external equipment, and Tmax is the maximum temperature allowable for the equipment inside the external equipment.

4. An underground temperature control apparatus, comprising:

an air discharging chamber; and an air introducing chamber, wherein the air discharging chamber and the air introducing chamber are in communication with each other inside the underground temperature control apparatus, wherein the air discharging chamber is in communication with an air introducing chamber of an external equipment, and the air introducing chamber is in communication with an air discharging chamber of the external equipment such that an air circulating circuit is formed between the underground temperature control apparatus and the external equipment, wherein an air transporting device is installed in the air circulating circuit, wherein the underground temperature control apparatus further comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the underground temperature control apparatus further comprises a ground source system fan, an internal circulating fan, and a control module, wherein the ground source system fan is positioned between the air discharging chamber of the external equipment and the air introducing chamber of the underground temperature control apparatus, and when in operation, it forces air into the underground temperature control apparatus from the external equipment, wherein the internal circulating fan is positioned between the air discharging chamber of the external equipment and the air introducing chamber of the external equipment, and when in operation, it forces air into the air introducing chamber of the external equipment from the air discharging chamber of the external equipment, wherein the control module is configured to control operations of the ground source system fan and the internal circulating fan according to a controlling strategy, and wherein the controlling strategy of the ground source system fan and the internal circulating fan comprises:

when $Ta \leq T0$ and $Te \geq Tmax$, the ground source system fan starts and runs while the internal circulating fan stops, wherein Ta is an environmental air temperature, T0 is a reference temperature, Te is a temperature of the equipment inside the external equipment, and Tmax is the maximum temperature allowable for the equipment inside the external equipment.

5. A cabinet temperature control system for controlling temperature of equipment inside a cabinet, comprising:

a cabinet; and an underground temperature control unit, wherein the cabinet comprises an air discharging chamber and an air introducing chamber, and the air discharging chamber and the air introducing chamber of the cabinet are in communication with each other inside the cabinet, wherein an air transporting device is installed in a position at which the air discharging chamber of the cabinet and the air introducing chamber of the cabinet are connected, wherein the underground temperature control unit comprises an air discharging chamber and an air introducing chamber, and the air discharging chamber and the air introducing chamber of the underground temperature control unit are in communication with each other inside the underground temperature control unit, wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit, wherein the underground temperature control unit comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module, wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when $Ta > T0$, the ground source system fan starts and runs while the internal circulating fan stops, and when $Te < Tmax$, the rotational speed of the ground source system fan is controlled according to a rotational speed adjusting strategy, wherein Ta is an environmental air temperature, T0 is a reference temperature, Te is a temperature of the equipment, and Tmax is the maximum temperature allowable for the equipment.

6. A cabinet temperature control system for controlling temperature of equipment inside a cabinet, comprising:

a cabinet; and an underground temperature control unit, wherein the cabinet comprises an air discharging chamber and an air introducing chamber, and the air discharging chamber and the air introducing chamber of the cabinet are in communication with each other inside the cabinet, wherein an air transporting device is installed in a position at which the air discharging chamber of the cabinet and the air introducing chamber of the cabinet are connected, wherein the underground temperature control unit comprises an air discharging chamber and an air introducing chamber, and the air discharging chamber and the air introducing chamber of the underground temperature control unit are in communication with each other inside the underground temperature control unit, wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit, wherein the underground temperature control unit comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module, wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when Ta>T0, the ground source system fan starts and runs while the internal circulating fan stops, and when Te≥Tmax, the ground source system fan runs at a full speed, wherein Ta is an environmental air temperature, T0 is a reference temperature, Te is a temperature of the equipment, and Tmax is the maximum temperature allowable for the equipment.

7. A cabinet temperature control system for controlling temperature of equipment inside a cabinet, comprising:

a cabinet; and an underground temperature control unit, wherein the cabinet comprises an air discharging chamber and an air introducing chamber, and the air discharging chamber and the air introducing chamber of the cabinet are in communication with each other inside the cabinet, wherein an air transporting device is installed in a position at which the air discharging chamber of the cabinet and the air introducing chamber of the cabinet are connected, wherein the underground temperature control unit comprises an air discharging chamber and an air introducing chamber, and the air discharging chamber and the air introducing chamber of the underground temperature control unit are in communication with each other inside the underground temperature control unit, wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit, wherein the underground temperature control unit comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system, fan an internal circulating fan, and a control module, wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when Ta≤T0 and Te<Tmax, the internal circulating fan starts and runs at a full speed while the ground source system fan stops, wherein Ta is an environmental air temperature, T0 is a reference temperature, Te is a temperature of the equipment, and Tmax is the maximum temperature allowable for the equipment.

8. A cabinet temperature control system for controlling temperature of equipment inside a cabinet, comprising:

a cabinet; and an underground temperature control unit, wherein the cabinet comprises an air discharging chamber and an air introducing chamber, and the air discharging chamber and the air introducing chamber of the cabinet are in communication with each other inside the cabinet, wherein an air transporting device is installed in a position at which the air discharging chamber of the cabinet and the air introducing chamber of the cabinet are connected, wherein the underground temperature control unit comprises an air discharging chamber and an air introducing chamber, and the air discharging chamber and the air introducing chamber of the underground temperature control unit are in communication with each other inside the underground temperature control unit, wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit, wherein the underground temperature control unit comprises a radiator and an under round base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module, wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when Ta≤T0 and Te≥Tmax, the ground source system fan starts and runs while the internal circulating fan stops, wherein Ta is an environmental air temperature, T0 is a reference temperature, Te is a temperature of the equipment, and Tmax is the maximum temperature allowable for the equipment.

9. A cabinet for housing electronic equipment, comprising:
an air discharging chamber;
an air introducing chamber; and
an air transporting device, wherein the air discharging chamber and the air introducing chamber are in communication with each other inside the cabinet, wherein the air transporting device is installed inside the cabinet at a position where the air discharging chamber and the air introducing chamber of the cabinet are connected, wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device, wherein the external cooling device further comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module, wherein the ground source system fan is positioned between the air discharging chamber of the cabinet and the air introducing chamber of the external cooling device, and the ground source system fan forces air into the external cooling device from the cabinet when in operation, wherein the internal circulating fan is positioned between the air discharging chamber and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when Ta>T0, the ground source system fan starts and runs while the internal circulating fan stops, when Te<Tmax, the rotational speed of the ground source system fan is controlled according to a rotational speed adjusting strategy, wherein Ta is an environmental air temperature, T0 is a reference temperature, Te is a temperature of the equipment, and Tmax is the maximum temperature allowable for the equipment.

10. A cabinet for housing electronic equipment, comprising:
an air discharging chamber;
an air introducing chamber; and
an air transporting device, wherein the air discharging chamber and the air introducing chamber are in communication with each other inside the cabinet, wherein the air transporting device is installed inside the cabinet at a position where the air discharging chamber and the air introducing chamber of the cabinet are connected, wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device, wherein the external cooling device further comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module, wherein the ground source system fan is positioned between the air discharging chamber of the cabinet and the air introducing chamber of the external cooling device, and the ground source system fan forces air into the external cooling device from the cabinet when in operation, wherein the internal circulating fan is positioned between the air discharging chamber and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when Ta>T0, the ground source system fan starts and runs while the internal circulating fan stops, and when Te≤Tmax, the ground source system fan runs at a full speed, wherein Ta is an environmental air temperature, T0 is a reference temperature, Te is a temperature of the equipment, and Tmax is the maximum temperature allowable for the equipment.

11. A cabinet for housing electronic equipment, comprising:
- an air discharging chamber;
- an air introducing chamber; and
- an air transporting device,
- wherein the air discharging chamber and the air introducing chamber are in communication with each other inside the cabinet,
- wherein the air transporting device is installed inside the cabinet at a position where the air discharging chamber and the air introducing chamber of the cabinet are connected,
- wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device,
- wherein the external cooling device further comprises a radiator and an underground base to which the radiator is connected in a sealed connection,
- wherein one end of the radiator is positioned in the air circulating circuit inside the underground base and another end of the radiator generates the underground base and extends into the soil around the underground base,
- wherein the cabinet further comprises a ground source system fan, an internal circulating fan, and a control module,
- wherein the ground source system fan is positioned between the air discharging chamber of the cabinet and the air introducing chamber of the external cooling device, and the ground source system fan forces air into the external cooling device from the cabinet when in operation,
- wherein the internal circulating fan is positioned between the air discharging chamber and the air introducing chamber of the cabinet, and the internal circulating fan forces air into the air introducing chamber of the cabinet from the air discharging chamber of the cabinet when in operation,
- wherein the control module is configured to control operations of the ground source system fan and the internal circulating fan according to a controlling strategy, and
- wherein the controlling strategy of the ground source system fan and the internal circulating fan comprises:
- when $Ta \leq T0$ and $Te < Tmax$, the internal circulating fan starts and runs at a full speed while the ground source system fan stops,
- wherein Ta is an environmental air temperature, T0 is a reference temperature, Te is a temperature of the equipment, and Tmax is the maximum temperature allowable for the equipment.

12. A cabinet for housing electronic equipment, comprising:
- an air discharging chamber;
- an air introducing chamber; and
- an air transporting device,
- wherein the air discharging chamber and the air introducing chamber are in communication with each other inside the cabinet,
- wherein the air transporting device is installed inside the cabinet at a position where the air discharging chamber and the air introducing chamber of the cabinet are connected,
- wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device,
- wherein the external cooling device further comprises a radiator and an underground base to which the radiator is connected in a sealed connection,
- wherein one end of the radiator is positioned in the air circulating circuit inside the underground base and another end of the radiator penetrates the underground base and extends into the soil around the underground base,
- wherein the cabinet further comprises a ground source system fan, an internal circulating fan, and a control module,
- wherein the ground source system fan is positioned between the air discharging chamber of the cabinet and the air introducing chamber of the external cooling device, and the ground source system fan forces air into the external cooling device from the cabinet when in operation,
- wherein the internal circulating fan is positioned between the air discharging chamber and the air introducing chamber of the cabinet, and the internal circulating fan forces air into the air introducing chamber of the cabinet from the air discharging chamber of the cabinet when in operation,
- wherein the control module is configured to control operations of the ground source system fan and the internal circulating fan according to a controlling strategy, and
- wherein the controlling strategy of the ground source system fan and the internal circulating fan comprises:
- when $Ta \leq T0$ and $Te \geq Tmax$, the ground source system fan starts while the internal circulating fan stops,
- wherein Ta is an environmental air temperature, T0 is a reference temperature, Te is a temperature of the equipment, and Tmax is the maximum temperature allowable for the equipment.

* * * * *

UNITED STATES PATENT AND TRADEMARK OFFICE
CERTIFICATE OF CORRECTION

PATENT NO. : 8,839,848 B2
APPLICATION NO. : 12/849779
DATED : September 23, 2014
INVENTOR(S) : Weixing Wu et al.

It is certified that error appears in the above-identified patent and that said Letters Patent is hereby corrected as shown below:

In the Claims,

Col. 11, line 38, Claim 7 should read:

A cabinet temperature control system for controlling temperature of equipment inside a cabinet, comprising:
  a cabinet; and
  an underground temperature control unit,
  wherein the cabinet comprises an air discharging chamber and an air introducing chamber, and the air discharging chamber and the air introducing chamber of the cabinet are in communication with each other inside the cabinet,
  wherein an air transporting device is installed in a position at which the air discharging chamber of the cabinet and the air introducing chamber of the cabinet are connected,
  wherein the underground temperature control unit comprises an air discharging chamber and an air introducing chamber, and the air discharging chamber and the air introducing chamber of the underground temperature control unit are in communication with each other inside the underground temperature control unit,
  wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit,
  wherein the underground temperature control unit comprises a radiator and an underground base to which the radiator is connected in a sealed connection,
  wherein one end of the radiator is positioned in the air circulating circuit inside the underground base and another end of the radiator penetrates the underground base and extends into the soil around the underground base,
  wherein the cabinet further comprises a ground source system fan, an internal circulating fan, and a control module, Signed and Sealed this
Tenth Day of February, 2015

Michelle K. Lee
*Deputy Director of the United States Patent and Trademark Office*

CERTIFICATE OF CORRECTION (continued)
U.S. Pat. No. 8,839,848 B2 wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and wherein the controlling strategy of the ground source system fan and the internal circulating fan comprises:

when $Ta \leq T0$ and $Te < Tmax$, the internal circulating fan starts and runs at a full speed while the ground source system fan stops, wherein Ta is an environmental air temperature, T0 is a reference temperature, Te is a temperature of the equipment, and Tmax is the maximum temperature allowable for the equipment.

Column 12, Line 32, Claim 8 should read:

A cabinet temperature control system for controlling temperature of equipment inside a cabinet, comprising:

a cabinet; and an underground temperature control unit, wherein the cabinet comprises an air discharging chamber and an air introducing chamber, and the air discharging chamber and the air introducing chamber of the cabinet are in communication with each other inside the cabinet, wherein an air transporting device is installed in a position at which the air discharging chamber of the cabinet and the air introducing chamber of the cabinet are connected, wherein the underground temperature control unit comprises an air discharging chamber and an air introducing chamber, and the air discharging chamber and the air introducing chamber of the underground temperature control unit are in communication with each other inside the underground temperature control unit, wherein the air discharging chamber of the cabinet and the air introducing chamber of the underground temperature control unit are in communication with each other, and the air discharging chamber of the underground temperature control unit and the air introducing chamber of the cabinet are in communication with each other such that an air circulating circuit is formed between the cabinet and the underground temperature control unit, wherein the underground temperature control unit comprises a radiator and an underground base to which the radiator is connected in a sealed connection, wherein one end of the radiator is positioned in the air circulating circuit inside the underground base and another end of the radiator penetrates the underground base and extends into the soil around the underground base, wherein the cabinet further comprises a ground source system fan, an internal circulating fan, and a control module,

CERTIFICATE OF CORRECTION (continued)
U.S. Pat. No. 8,839,848 B2 wherein the ground source system fan is positioned between the air discharging chamber of the cabinet and the air introducing chamber of the underground temperature control unit, and the ground source system fan forces air into the underground temperature control unit from the cabinet when in operation, wherein the internal circulating fan is positioned between the air discharging chamber of the cabinet and the air introducing chamber of the cabinet, and the internal circulating fan forces air into the air introducing chamber of the cabinet from the air discharging chamber of the cabinet when in operation, wherein the control module is configured to control operations of the ground source system fan and the internal circulating fan according to a controlling strategy, and The cabinet temperature control system according to claim 2, wherein the controlling strategy of the ground source system fan and the internal circulating fan comprises:

when $Ta \leq T0$ and $Te \geq Tmax$, the ground source system fan starts and runs while the internal circulating fan stops, wherein $Ta$ is an environmental air temperature, $T0$ is a reference temperature, $Te$ is a temperature of the equipment, and $Tmax$ is the maximum temperature allowable for the equipment.

Column 14, Line 12, Claim 10 should read:

A cabinet for housing electronic equipment, comprising:
 an air discharging chamber;
 an air introducing chamber; and
 an air transporting device,
 wherein the air discharging chamber and the air introducing chamber are in communication with each other inside the cabinet,
 wherein the air transporting device is installed inside the cabinet at a position where the air discharging chamber and the air introducing chamber of the cabinet are connected,
 wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device,
 wherein the external cooling device further comprises a radiator and an underground base to which the radiator is connected in a sealed connection,
 wherein one end of the radiator is positioned in the air circulating circuit inside the underground base and another end of the radiator penetrates the underground base and extends into the soil around the underground base,
 wherein the cabinet further comprises a ground source system fan, an internal circulating fan, and a control module,
 wherein the ground source system fan is positioned between the air discharging chamber of the cabinet and the air introducing chamber of the external cooling device, and the ground source system fan forces air into the external cooling device from the cabinet when in operation,
 wherein the internal circulating fan is positioned between the air discharging chamber and the air introducing chamber of the cabinet, and the internal circulating fan forces air into the air introducing chamber of the cabinet from the air discharging chamber of the cabinet when in operation,
 wherein the control module is configured to control operations of the ground source system fan and the internal circulating fan according to a controlling strategy, and wherein the controlling strategy of the ground source system fan and the internal circulating fan comprises:

when $Ta>T0$, the ground source system fan starts and runs while the internal circulating fan stops, and when $Te \geq Tmax$, the ground source system fan runs at a full speed, wherein Ta is an environmental air temperature, T0 is a reference temperature, Te is a temperature of the equipment, and Tmax is the maximum temperature allowable for the equipment.

Column 15, Line 1, Claim 11 should read:

A cabinet for housing electronic equipment, comprising:
  an air discharging chamber;
  an air introducing chamber; and
  an air transporting device,
  wherein the air discharging chamber and the air introducing chamber are in communication with each other inside the cabinet,
  wherein the air transporting device is installed inside the cabinet at a position where the air discharging chamber and the air introducing chamber of the cabinet are connected,
  wherein the air discharging chamber of the cabinet is in communication with an air introducing chamber of an external cooling device and the air introducing chamber of the cabinet is in communication with an air discharging chamber of the external cooling device such that an air circulating circuit is formed between the cabinet and the external cooling device,
  wherein the external cooling device further comprises a radiator and an underground base to which the radiator is connected in a sealed connection,
  wherein one end of the radiator is positioned in the air circulating circuit inside the underground base and another end of the radiator penetrates the underground base and extends into the soil around the underground base,
  wherein the ground source system fan is positioned between the air discharging chamber of the cabinet and the air introducing chamber of the external cooling device, and the ground source system fan forces air into the external cooling device from the cabinet when in operation,
  wherein the internal circulating fan is positioned between the air discharging chamber and the air introducing chamber of the cabinet, and the internal circulating fan forces air into the air introducing chamber of the cabinet from the air discharging chamber of the cabinet when in operation,
  wherein the control module is configured to control operations of the ground source system fan and the internal circulating fan according to a controlling strategy, and
  wherein the controlling strategy of the ground source system fan and the internal circulating fan comprises:
  when $Ta \leq T0$ and $Te < Tmax$, the internal circulating fan starts and runs at a full speed while the ground source system fan stops,
  wherein Ta is an environmental air temperature, T0 is a reference temperature, Te is a temperature of the equipment, and Tmax is the maximum temperature allowable for the equipment.